United States Patent
Shih

(10) Patent No.: US 7,662,645 B2
(45) Date of Patent: Feb. 16, 2010

(54) REWORKED INTEGRATED CIRCUIT DEVICE AND REWORKING METHOD THEREOF

(75) Inventor: Hui-Shen Shih, Chang-Hua Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 92 days.

(21) Appl. No.: 11/851,377

(22) Filed: Sep. 6, 2007

(65) Prior Publication Data

US 2009/0065944 A1    Mar. 12, 2009

(51) Int. Cl.
*H01L 21/00*    (2006.01)
*H01L 29/40*    (2006.01)
(52) U.S. Cl. .......................... 438/4; 257/773
(58) Field of Classification Search .......... 257/E21.525, 257/E21.595, E21.214, E21.215; 438/4, 438/5, 16, 669, 672, 706
See application file for complete search history.

(56) References Cited

U.S. PATENT DOCUMENTS

2001/0050303 A1* 12/2001 Hartfield et al. ............. 228/103
2004/0142565 A1* 7/2004 Cooney et al. ............... 438/689
2004/0238964 A1* 12/2004 Kawano et al. .............. 257/758
2005/0037622 A1* 2/2005 Hsu et al. .................... 438/706
2005/0218509 A1* 10/2005 Kipnis et al. ................ 257/723
2006/0088991 A1* 4/2006 Kim ............................ 438/597

OTHER PUBLICATIONS

S.M. Sze, "Semiconductor Devices.Physics and Technology", 2002, John Willey & Sons, pp. 441-443.*

* cited by examiner

*Primary Examiner*—Thomas L Dickey
*Assistant Examiner*—Nikolay Yushin
(74) *Attorney, Agent, or Firm*—Winston Hsu

(57) ABSTRACT

Reworking method for removing defects on integrated circuit device is disclosed. An integrated circuit is provided, which has a substrate, a conductive material layer formed in the substrate, a dielectric layer formed on the substrate, at least a contact plug embedded in the dielectric layer, and a conductive layer contacting to the contact plug formed on the dielectric layer. A defect is found in the conductive layer and the reworking method is performed, including an etch back process, a chemical mechanical polishing process, and a deposition process. The reworking method removes the prior formed conductive layer and reform a conductive layer to prevent the integrated circuit from being scraped.

13 Claims, 12 Drawing Sheets

REWORKED INTEGRATED CIRCUIT DEVICE AND REWORKING METHOD THEREOF

BACKGROUND OF THE INVENTION

1. Field of the Invention

The present invention is related to a reworking method for removing defects on integrated circuit devices, and particularly, to a reworking method for removing defects on the conductive layer of a metal interconnection and for rebuilding the conductive layer to reduce the scrape rate of the integrated circuit device.

2. Description of the Prior Art

Integrated circuit devices have a tendency toward higher density and higher integration. In recent years, integrated circuit devices are formed as multi-layered metal interconnections for increasing the electrical connections between the metal interconnections themselves or between the integrated circuit devices and the metal interconnections. The fabrication process of the integrated circuit devices is very complicated. Integrated circuit devices are typically fabricated after gone through hundreds of different processing steps. For example, during the process of the formation of the metal interconnection, a barrier layer, a metal layer, and an anti-reflective layer are sequentially formed on a wafer having a dielectric layer thereon; then, the definition of the pattern is performed by lithographic and etching processes.

However, particle contamination occurs during many of the processing steps, and thereby results in yield loss. These particles can be disposed onto the surface of the respective integrated circuit devices, and resulting in bridging or broken circuit connections between two components, and causing damage to normal functions. Besides, when the compositions of the deposited film are irregular, the integrated circuit may end up having a rugged surface, with defects such as a hillock or a void formed on the surface. These defects can result in signal timing discrepancies and undesirable parametric yield loss, thus affecting the quality of the integrated circuit devices thereby failing quality inspection, and is to be assessed as defective products, and thus cannot be transferred to the next production step. Moreover, sometimes entire batch of wafers having defects must be scraped. As a result, scraping of wafers not only increases product cost, reduces utilization efficiency of equipments, and delays delivery of the products.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

It is therefore an objective of the present invention to provide a reworking method to remove defects on integrated circuit devices, thereby reducing costs resulting from wafer scraping.

According to the present invention, a reworking method to remove defects on the integrated circuit devices is disclosed. Initially, an integrated circuit device is provided. The integrated circuit device has substrate, a conductive material layer formed in the substrate, a dielectric layer formed on the substrate, at least one contact plug, connecting to the conductive material layer, embedded in the dielectric layer, and a conductive layer, connecting to the contact plug, formed on the dielectric layer. An etch back process is performed thereafter to substantially remove the conductive layer and to expose the contact plug and reveal a surface of the dielectric layer. A chemical mechanical polishing process is then performed on the dielectric layer. Finally, a conductive layer, contacting the contact plug, is reformed on the dielectric layer.

Another objective of the present invention is to provide a reworked integrated circuit device. The reworked integrated circuit device has a substrate, a conductive material layer formed in the substrate, and a metal interconnection disposed on the substrate. The metal interconnection includes a conductive trace, and the substrate layer has step-like edge positioned next to the conductive trace.

Accordingly, the reworking method of the present invention is able to efficiently and effectively remove the conductive layer disposed on the dielectric layer which is to be rebuilt without impairing the reliability of the integrated circuit devices.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
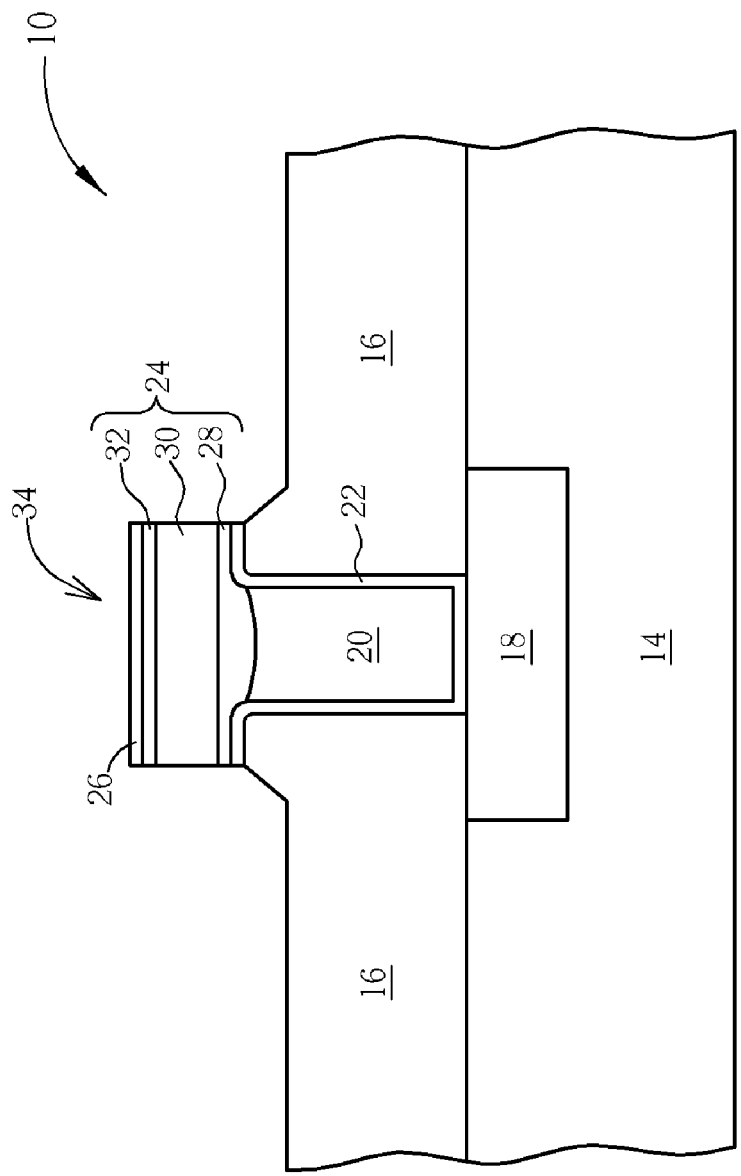
FIGS. 1-6 are schematic diagrams illustrating a reworking method to remove defects on an integrated circuit device according to a first preferred embodiment of the present invention.

Hereinafter, preferred embodiments of the present invention will be described with reference to the accompanying drawings, in which components with substantially the same functions are identified by the same reference numeral for the sake of simplicity. It should be noted, however, that the present invention is in no way limited to the following illustrative embodiments.

Please refer to FIG. 1-6, which are schematic diagrams illustrating a reworking method to remove defects on an integrated circuit device according to a first preferred embodiment of the present invention. An integrated circuit device 10 is provided. The integrated circuit device 10 includes a substrate 14 and a dielectric layer 16. The integrated circuit device 10 also has a conductive material layer 18 embedded in the substrate 14. A contact plug 20 is formed in the dielectric layer 16, and the contact plug 20 is electrically connected to the conductive material layer 18. A barrier layer 22, a first conductive layer 24, and an anti-reflective layer 26 are sequentially formed on the dielectric layer 16. The substrate 14 of the first preferred embodiment may comprise a silicon substrate, or a silicon substrate having a dielectric layer disposed thereon. The material of the dielectric layer 16 includes silicon oxide, fluoride silicate glass (FSG), or other dielectric materials used for semiconductor devices. The conductive material layer 18 formed in the substrate 14 can take on many forms, for example, a metal layer; a wiring layer; a silicide layer comprising titanium (Ti), cobalt (Co), nickel (Ni), or copper (Cu); a poly electrode; a metal interconnection composed of a conductive trace and a contact plug; or a metal interconnection formed by a damascene process and a copper process.

The contact plug 20, for connecting to various different metal interconnections, of the present embodiment is made of tungsten (W), but the material of the contact plug 20 may also include aluminum (Al), copper (Cu), or other metal of superior conductivity. An ideal material of the barrier 22 not only blocks diffusion and penetration of the first conductive layer 24, but should also possess properties of lower resistivity and increased adhesion between the first conductive layer 24 and the dielectric layer 16. Therefore, the material of the barrier layer 22 may include titanium Ti, tantalum (Ta), titanium tungsten alloy (TiW), titanium nitride (TiN), tungsten nitride ($WN_x$), tantalum nitride (TaN), WsiN, TiSiN, or combinations thereof. The barrier layer 22 of the present embodiment is made of TiN. Furthermore, forming the contact plug 20 shown in FIG. 2, a chemical mechanical polishing (CMP) process is performed to planarize a top surface of the contact plug 20. Therefore, a part of the barrier layer 22 is remained on the dielectric layer 16. However, if the forming process of the contact plug 20 includes a etch back process to planarize the top surface of the contact plug, the barrier layer 22 disposed on the surface of the dielectric layer 16 will be removed. Consequently, the conductive layer 24 contacts the dielectric layer 16 directly.

Aluminum, when considered for use as the main conductive material, has advantages of lower resistivity, having superior adhesion to silicon oxide, and capable of being conveniently etched by using boron trichloride/dichloride ($BCl_3$/$Cl_2$). In addition, conductive material as aluminum may also reduce RC time delay and increase switching frequency of the device. Therefore, the first conductive layer 24 of the present embodiment is a multi-layered structure, in which aluminum is the substantial material. The first conductive layer 24 of the present embodiment can include a first TiN/Ti layer 28, an aluminum-copper alloy (AlCu) alloy layer 30, and a second TiN/Ti layer 32, which are sequentially formed as the first conductive layer 24. The AlCu alloy layer 30 is a main material used for forming the conductive traces and for conducting the current. The first TiN/Ti layer 28 or the second TiN/Ti layer 32 is capable of reducing the contact resistance between the first conductive layer 24 and the contact plug 20. The TiN layer 28 or the TiN/Ti layer 32 is also able to prevent the copper of the AlCu alloy layer 30 diffusing from the AlCu alloy layer 30 to the dielectric layers that causes damages. The first TiN/Ti layer 28 or the second TiN/Ti layer 32 is a multi-layered structure, which is formed by alternatively disposing a plurality of Ti film and a plurality of TiN film. However, the first TiN/Ti layer 28 or the second TiN/Ti layer 32 may be replaced by a single-layered Ti film or a single-layered TiN film, which will work as good as the multi-layered TiN/Ti layer used in the present preferred embodiment. Moreover, the advanced technique, such as a damascene process, may also use materials with a lower resistance than aluminum, such as copper, to replace aluminum as the substantial material of the first conductive layer 24 and to reduce RC delay time. The anti-reflective layer 26 of the integrated circuit device 10 may use TiN, tungsten nitride, amorphous silicon, or silicon oxynitride as material. The anti-reflective layer 26 of the present embodiment comprises silicon oxynitride. The anti-reflective layer 26 prevents reflections from the underlying metal layers during the photoresist exposure of the lithography process; therefore, the pattern of the conductive traces is then more accurate. The reworking method of the present embodiment of the present invention is performed on a conductive trace 34, which is formed by a lithography process and an etch process to define a pattern on the first conductive layer 24.

The conductive trace 34 is formed by several processes, including a deposition, a lithography, and an etching process. When an operator finds out about products irregularity, that the composition of the reacting gases is irregular, or the defects detected during quality control inspections, such as a hillock or a void formed on the conductive trace 34, the reworking method of the present invention may be performed to remove these defects.

Figure 2:
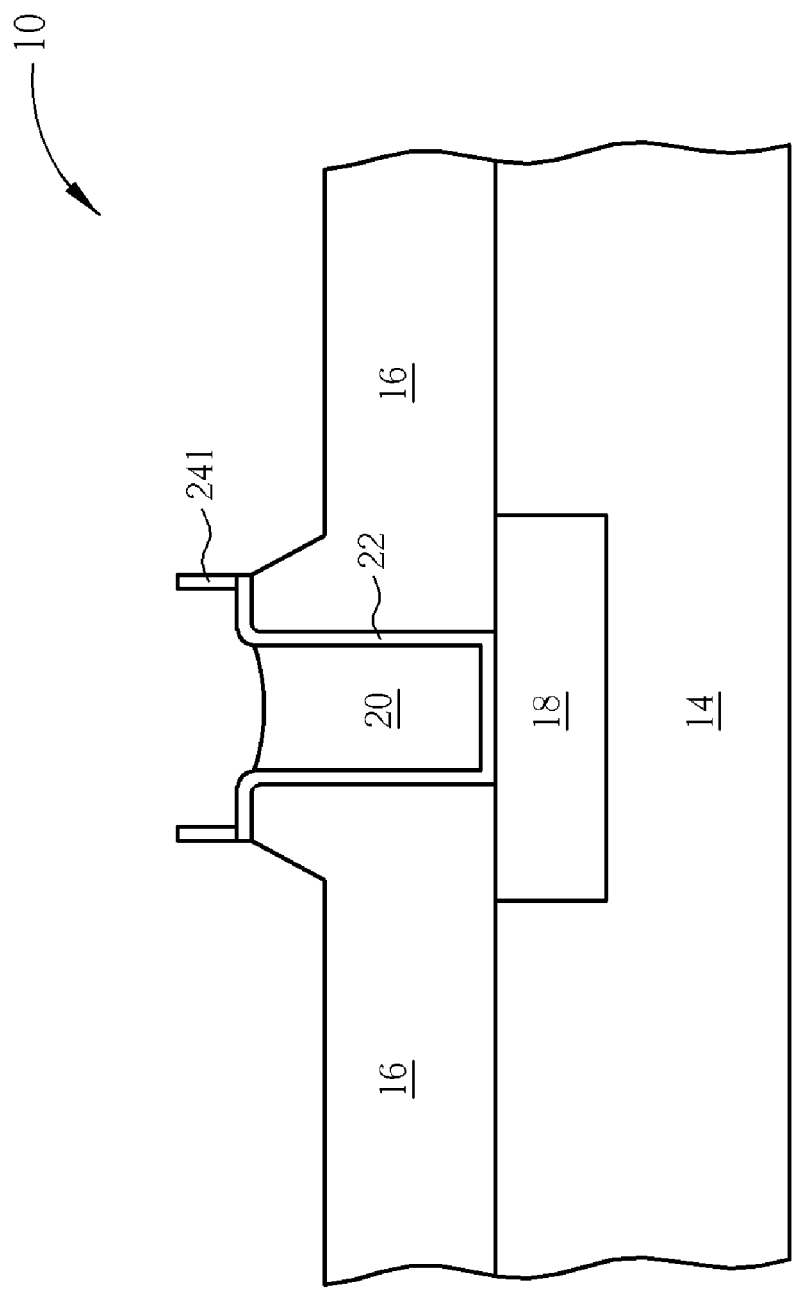
Figure 3:
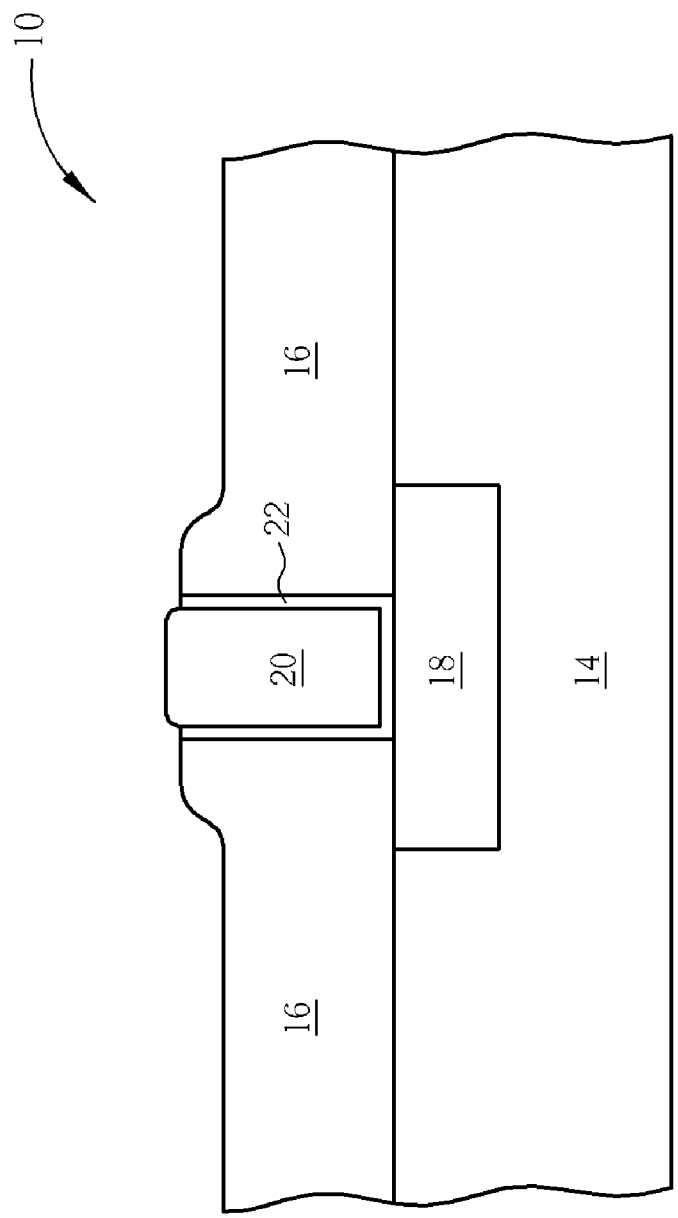

Hereinafter, an after etch inspection (AEI) of the first conductive layer 24, which is patterned, is used as an example, after the AEI is performed and upon discovery of at least a defect, an etch back process is performed as shown in FIG. 2 to remove most of the first conductive layer 24 and to reveal a surface of the contact plug 20 and a surface of the dielectric layer 16. Because the etch back process may etch a portion of the second dielectric layer 16, and also the etch back process etches the first conductive layer 24 faster than it etches the contact plug 20; therefore, after the etch back process is performed, the top surface of the contact plug 20 is protruded from the surface of the dielectric layer 16 more so than that of the contact plug 20 before the etch back process is performed. The etch back process of the present embodiment is a dry etch process, but a wet etch process is also allowable to remove a substantial portion or entire portion of the first conductive layer 24. As the wet etch process is performed, an etchant solution should be selected in which having a faster etching rate for the first conductive layer 24 than the contact plug 20, to thereby prevent the contact plug 20 from being damaged during the etch process.

Because the first conductive layer 24 is contaminated by particles during the deposition process or the etch process, a conductive layer residue 241 cannot be removed and is to remain on the barrier layer 22. Accordingly, a CMP process is performed to remove the conductive layer residue 241 and a portion of the barrier layer 22 formed on the surface of the dielectric layer 16 at the same time. In addition during the CMP process, besides the slurry used in the CMP process, an oxidant may be added in the slurry to accelerate the removal of the conductive layer residue 241 and the barrier layer 22.

Figure 4:
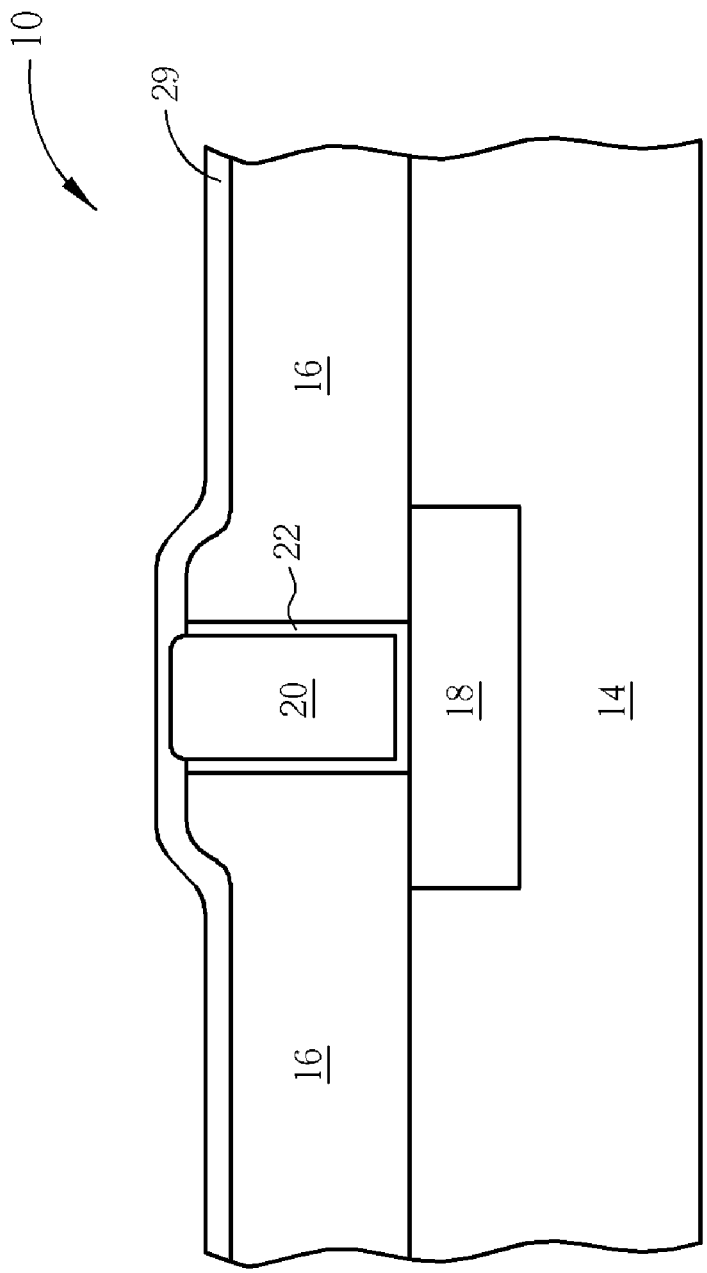

At this time, the defects on the first conductive layer 24 have been removed. To maintain the completeness of the integrated circuit device 10, the following steps are performed to rebuild a second conductive layer 25. As shown in FIG. 4, a first TiN/Ti layer 29 is re-deposited to cover the contact plug 20 and the surface of the dielectric layer 16. The first TiN/Ti layer 29 of the present preferred embodiment is a multi-layered structure including a plurality of Ti film and a plurality of TiN film disposed alternatively. The first TiN/Ti layer 29 may be replaced by a single-layered Ti film or a single-layered TiN film, which works as good as the multi-layered TiN/Ti layer. The first TiN/Ti layer 29 is one of the layers of the second conductive layer 25.

Figure 5:
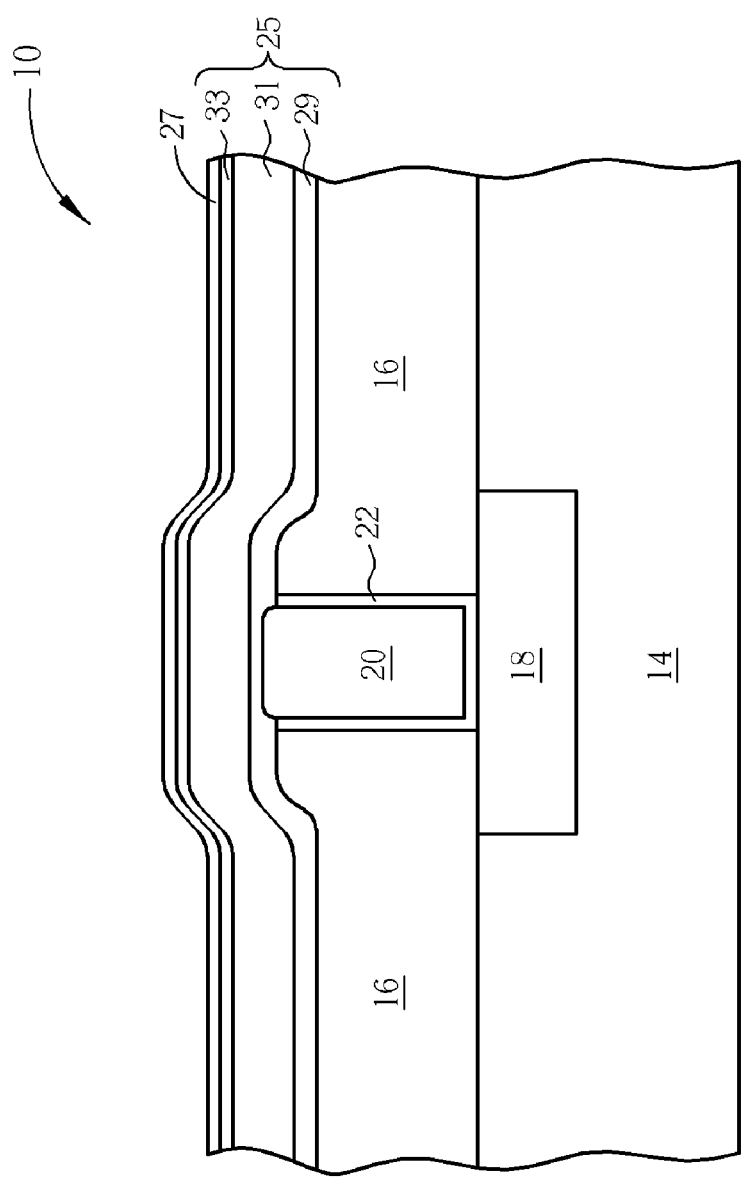

As shown in FIG. 5, other layers of the second conductive layer 25, which is a multi-layered structure, are formed in the following steps, such as an AlCu alloy layer 31, a second Ti/TiN layer 33, and an anti-reflective layer 27 are deposited on the Ti/TiN layer 33, sequentially. The anti-reflective layer 27 is preferably formed by using a sputtering process, but other methods of forming the anti-reflective layer 27 are allowable. Thus, the multi-layered structure of the second conductive layer 25 is formed.

Figure 6:
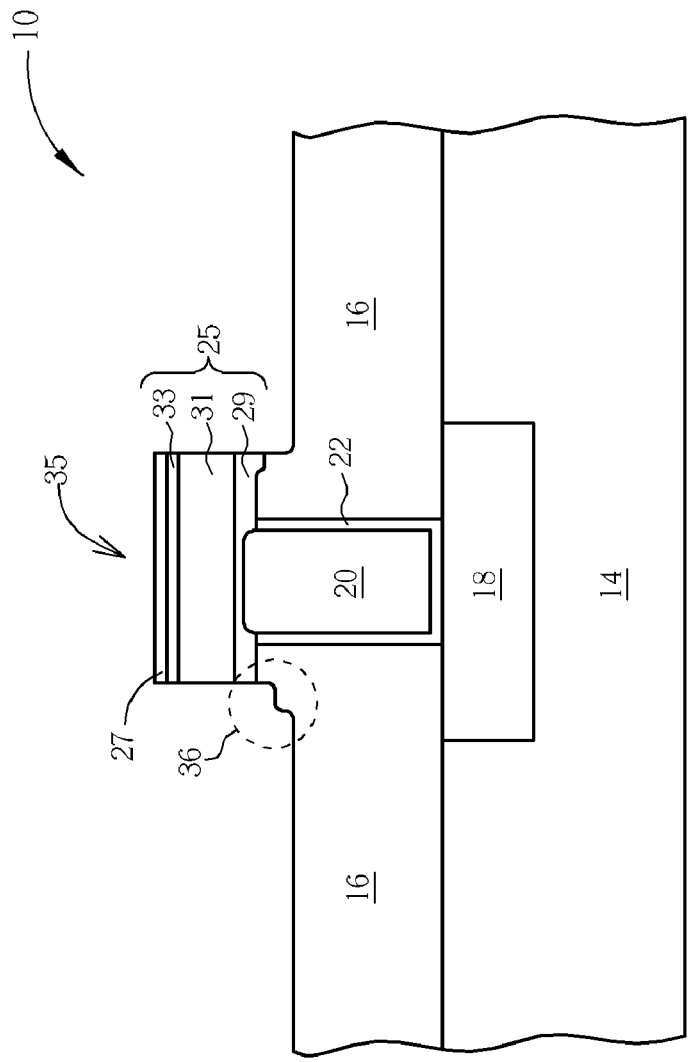

After the multi-layered structure of the second conductive layer 25 is formed, an inspection process is performed to ensure the reworked second conductive layer 25 is defect-free. The inspection process performs a comprehensive checkup to detect for any defects on the second conductive layer 25, such as particle contaminations, hillocks, or voids formed in the second conductive layer 25. After the inspection, a pattern defining process is performed. A photoresist layer (not shown) is formed on the second conductive layer 25. A lithography process is performed to transfer a pattern of the conductive trace from a pattern mask to the photoresist. An etch process is again performed to etch and define the pattern on the second conductive layer 25, thereby forming a conductive trace 35 as shown in FIG. 6. It is to be noted that, due to the potential for a misalignment to occur when transferring the pattern from the pattern mask by lithography, therefore, when the pattern of the conductive trace 35 is redefined, the dielectric layer 16 is then partially etched. As a result, an asymmetrical structure is formed at both edges of the dielectric layer 16 next to the conductive trace 35. As shown in FIG. 6, the conductive trace 35 of the present embodiment is slightly shifted to the right. In addition, a step-like structure 36 is formed at the left edge of the dielectric layer 16 next to the conductive trace 35. The right edge of the dielectric layer 16 next to the conductive trace 35 is also a step-like structure, but is to be asymmetrical compared to the left edge of the dielectric layer 16. Particularly, the coverage area by the second conductive layer 25 (or the conductive trace 35) is to be unequal among the left side and the right side.

Figure 7:
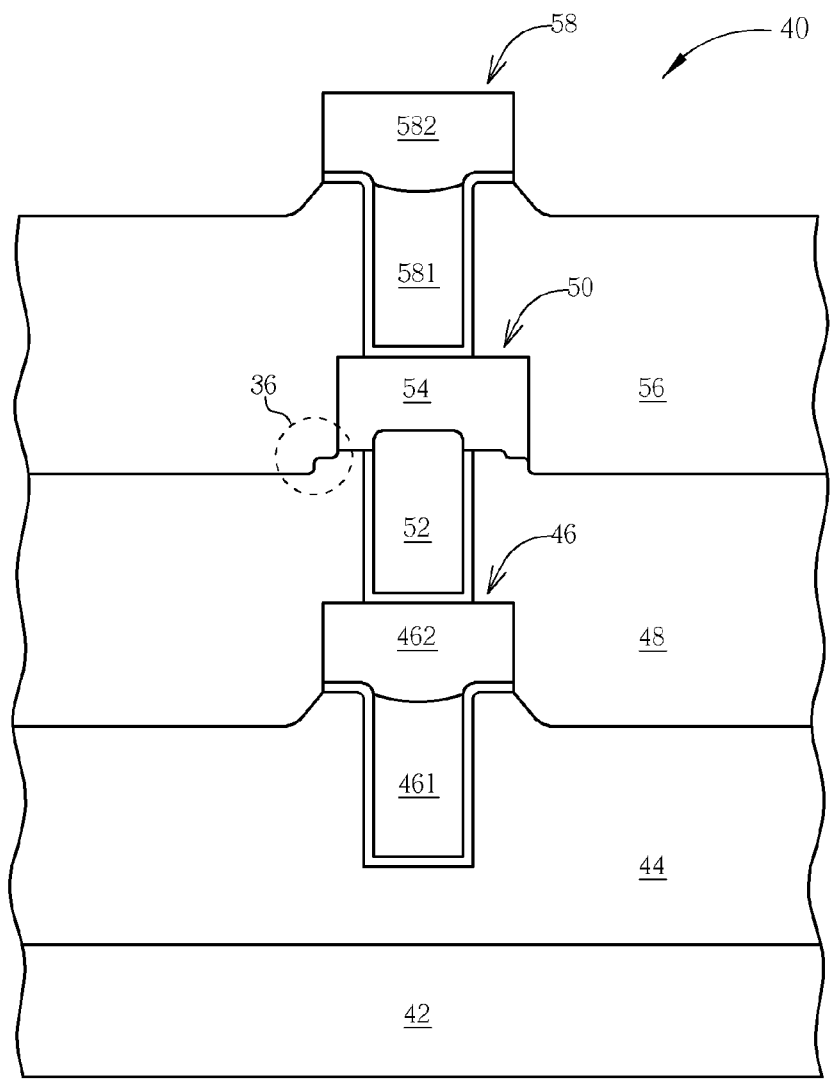
FIG. 7 is a schematic diagram illustrating a reworked integrated circuit device according to the first preferred embodiment of the present invention.

It should be noted that the reworked conductive trace as illustrated in the abovementioned embodiment is to have an asymmetric structure, which becomes more obvious when compared to other metal interconnections formed without having any reworking method performed as shown in the following embodiment. Please refer to FIG. 7, which is a schematic diagram illustrating a reworked integrated circuit device 40 according to another preferred embodiment of the present invention. The integrated circuit device 40 includes a substrate 42, a plurality of dielectric layers 44, 48, 56 formed on the substrate 42, and a plurality of metal interconnections 46, 50, 58 embedded in the dielectric layers 44, 48, 56. Each of the metal interconnections 46, 50, 58 of the present embodiment is made of a conductive material to form a contact plug 461, 52, 581, and a conductive trace 462, 54, 582, respectively. A barrier layer is formed between each of the metal interconnections 46, 50, and 58 and each of the dielectric layers 44, 48, and 56. The barrier layer prevents the metal of the metal interconnections to diffuse from the metal interconnection to the dielectric layer. The metal interconnection of the present invention may be a conductive trace made of copper formed by a dual damascene process; a metal layer; a wiring layer; a silicide layer comprising Ti, Co, Ni, or Cu; a poly electrode; or other types of metal interconnections formed by known processes. Furthermore, the contact plugs 461, 581 shown in FIG. 7 are formed by processes including a CMP process. Consequently, a part of the barrier layer remains on the dielectric layers 44, 56. If the contact plugs 461, 581 is formed by process including a etch back process to planarize a surface of the contact plugs 461, 581, the barrier layer on the surface of the dielectric layers 44, 46 will be removed. The conductive traces 462, 582 contact the dielectric layers 44, 56, respectively.

Integrated circuit device 40 includes a first dielectric layer 44 formed on a substrate 42, a first metal interconnection 46 embedded in the first dielectric layer 44, and a second dielectric layer 48 covering on the first dielectric layer 44 and the first metal interconnection 46. The integrated circuit device 40 also has a second metal interconnection 50 embedded in the second dielectric layer 48. The second metal interconnection 50 includes a contact plug 52 and a conductive trace 54 formed on the contact plug 52. The integrated circuit device 40 further has a third dielectric layer 56 covering the second dielectric layer 48 and the second metal interconnection 50, and a third metal interconnection 58 formed in the third dielectric layer 56. The second metal interconnection 50 of the present embodiment is formed by the reworking method of the aforementioned embodiment of the present invention that is distinct from those metal interconnections without performing the reworking method of the present invention, such as the first metal interconnection 46 or the third metal interconnection 58. Comparing to the first metal interconnection 46 and the third intermetal connection 58, the second metal interconnection 50 has an asymmetric structure.

As shown in FIG. 7, the first metal interconnection 46 and the third metal interconnection 58 of the integrated circuit device 40 are formed without any reworking method being performed. Accordingly, the first dielectric layer 44 and the third dielectric layer 56 will be partially etched correspondingly once during the pattern defining process to define the conductive traces 462, 582 using a pattern mask, and a respective smooth edge of the first dielectric layer 44 and the third dielectric layer 56 is formed next to the conductive trace 462, 582 due to the covering effect of the conductive traces 462, 582. However, the second interconnection 50 is formed by the reworking method of the present invention. The second dielectric layer 48 is partially etched during the first-time pattern defining process, and the second dielectric layer 48 is partially etched again during the reworking method. For example, a misalignment may have occurred when using a pattern mask for defining the pattern of the conductive trace 54; therefore, the conductive trace 54 is slightly shifted to the right, and the second dielectric layer 48 is being etched twice during the pattern defining process. Therefore, the left edge of the second dielectric layer 48 next to the conductive trace 54 is formed as a step-like structure 36. The right edge of the second dielectric layer 48 next to the conductive trace 54 is also another step-like structure, and is to be asymmetrical to the left edge of the second dielectric layer 48. Moreover, the etch back process of the reworking method also etches a portion of the second dielectric layer 48. Thus, the top surface of the contact plug 52 is protruded from the surface of the second dielectric layer 48. Comparing to the top surface of the contact plug 52, the top surfaces of the contact plugs 461, 581 of the first metal interconnection 46 and the third metal interconnection 58 which have not had reworking method performed and the surfaces of the dielectric layers 44, 56 are on the same plane. The metal interconnections 46, 50, 58 of the present embodiment are shown in FIG. 7 as a simplified diagram. The metal interconnection may be the multi-layered structure as the present embodiment shown, or a single-layered metal layer (not shown). The material of the conductive trace may include copper, aluminum, titanium nitride, AlCu alloy, TiN/Ti, or combinations thereof. The material of the contact plug comprises tungsten, aluminum, copper, or combinations thereof. In addition, an anti-reflective layer of TiN, tungsten nitride, amorphous silicon, silicon oxynitride, or other usable material may be formed covering on the conductive trace to improve the accuracy of exposure when defining the pattern of the conductive trace.

The reworking method of the present invention not only can be performed on an integrated circuit device having a defined conductive trace pattern, but also can be performed when a defect is found on any layer of the multi-layered structure of the conductive layers during a deposition process. Please refer to FIG. 8 and FIG. 9, which are schematic diagrams illustrating the reworking method of the present invention according to a second preferred embodiment. The reworking method is performed on the conductive layer to remove defects, such as when detecting the presence of hillocks or voids on the conductive layer, before the pattern of the conductive trace is defined.

Figure 8:
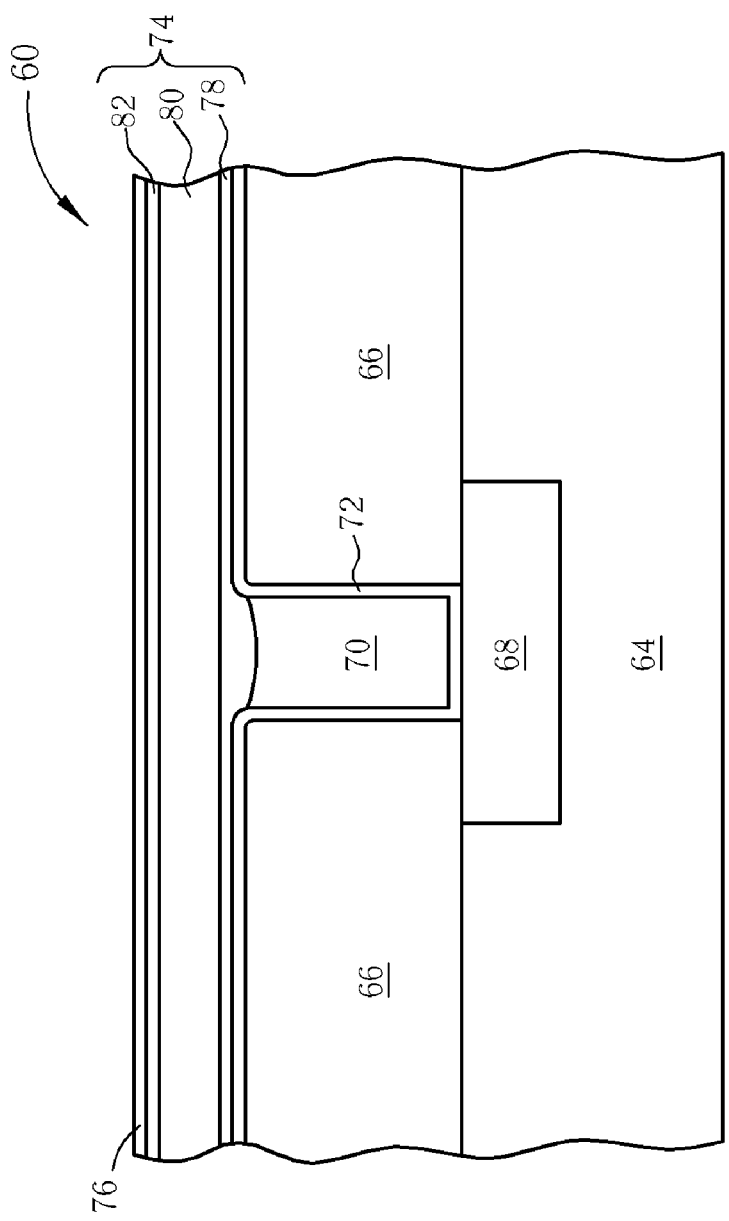
FIG. 8 and FIG. 9 are schematic diagrams further illustrating the reworking method according to a second preferred embodiment of the present invention.

As shown in FIG. 8, an integrated circuit device 60 is provided. The integrated circuit device 60 has a substrate 64 and a dielectric layer 66. The integrated circuit device 60 also has a conductive material layer 68 embedded in the substrate 64. A contact plug 70 is formed in the dielectric layer 66, and the contact plug 70 is electrically connected to the conductive material layer 68. A barrier layer 72 and a conductive layer 74 are sequentially formed on the dielectric layer 66. The conductive material layer 68 of the present embodiment can take on many forms, for example, a metal layer; a wiring layer; a silicide layer comprising Ti, Co, Ni, or Cu; a poly electrode; a metal interconnection composed of a conductive trace and a contact plug; or a metal interconnection formed by a damascene process and a copper process. The conductive layer 74 of the present embodiment is a multi-layered structure, same as the first conductive layer 24 shown in the abovementioned embodiment. The conductive layer 74 sequentially includes a first TiN/Ti layer 78, an AlCu alloy layer 80, and a second TiN/Ti layer 82, but is not limited to this. However, the first conductive layer 74 of the present embodiment may be formed a single-layered structure (not shown), such as a single metal layer made of copper. The contact plug 70 of the present embodiment is made of tungsten, but the material of the contact plug 70 may also be made of aluminum, copper, or other metal of good conductivity. Furthermore, forming the contact plug 70 shown in FIG. 8, a CMP process is performed to planarize a top surface of the contact plug 70. Therefore, a part of the barrier layer 72 is remained on the dielectric layer 66. However, if the forming process of the contact plug 70 includes a etch back process to planarize the top surface of the contact plug, the barrier layer 72 disposed on the surface of the dielectric layer 66 will be removed. Consequently, the conductive layer 74 contacts the dielectric layer 76 directly.

Figure 9:
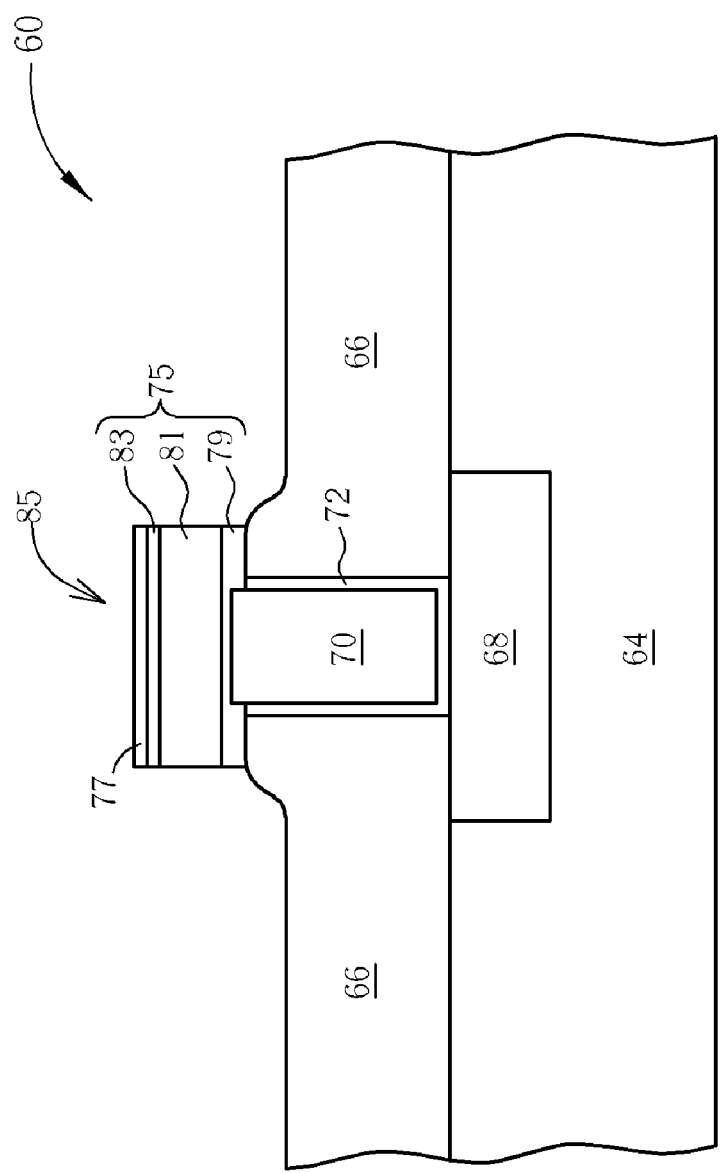

After deposition of the conductive layer 74 or deposition of a anti-reflective layer 76, defects on the integrated circuit device 60 may be detected. Thus, a reworking method of the present invention is performed to remove the defects. As illustrated in aforementioned embodiment, the reworking method of the present invention, including an etch back process, a CMP process, and a deposition process, is performed to rebuild a conductive layer 75 of the integrated circuit device 60 and an anti-reflective layer 77 on the second conductive layer 75, as illustrated in FIG. 9. The conductive layer 75 includes a first TiN/Ti layer 79, an AlCu alloy layer 81, and a second TiN/Ti layer 83. The first TiN/Ti layer 79 or the second TiN/Ti layer 83 is a multi-layered structure, which is formed by alternatively disposing a plurality of Ti film and a plurality of TiN film. However, the first TiN/Ti layer 79 or the second TiN/Ti layer 83 may be replaced by a single-layered Ti film or a single-layered TiN film, which will work as good as the multi-layered TiN/Ti layer used in the present preferred embodiment. The details of the fabrication process to form these layers are illustrated in the above-mentioned embodiment. Since the etch back process is performed to remove the first conductive layer 74, the etch back process simultaneously etches a portion of the dielectric layer 66. Therefore, the top surface of the contact plug 70 after being reworked will be more protruded from the surface of the dielectric layer 66 than that of the contact plug 70 before the reworking method is being performed. As illustrated in FIG. 9, after the multi-layered structure of the conductive layer 75 is formed, an inspection process is performed to ensure the reworked conductive layer 75 is a defect-free structure. The inspection process performs a comprehensive checkup to detect for any defects on the conductive layer 75, such as particle contaminations, hillocks, or voids formed in the conductive layer 75. After that, a pattern defining process is performed. A photoresist layer (not shown) is formed on the conductive layer 75. A lithography process is performed transferring a pattern of the conductive trace from a pattern mask to the photoresist. An etch process is performed to etch the conductive layer 75, and a conductive trace 85 is formed.

Figure 10:
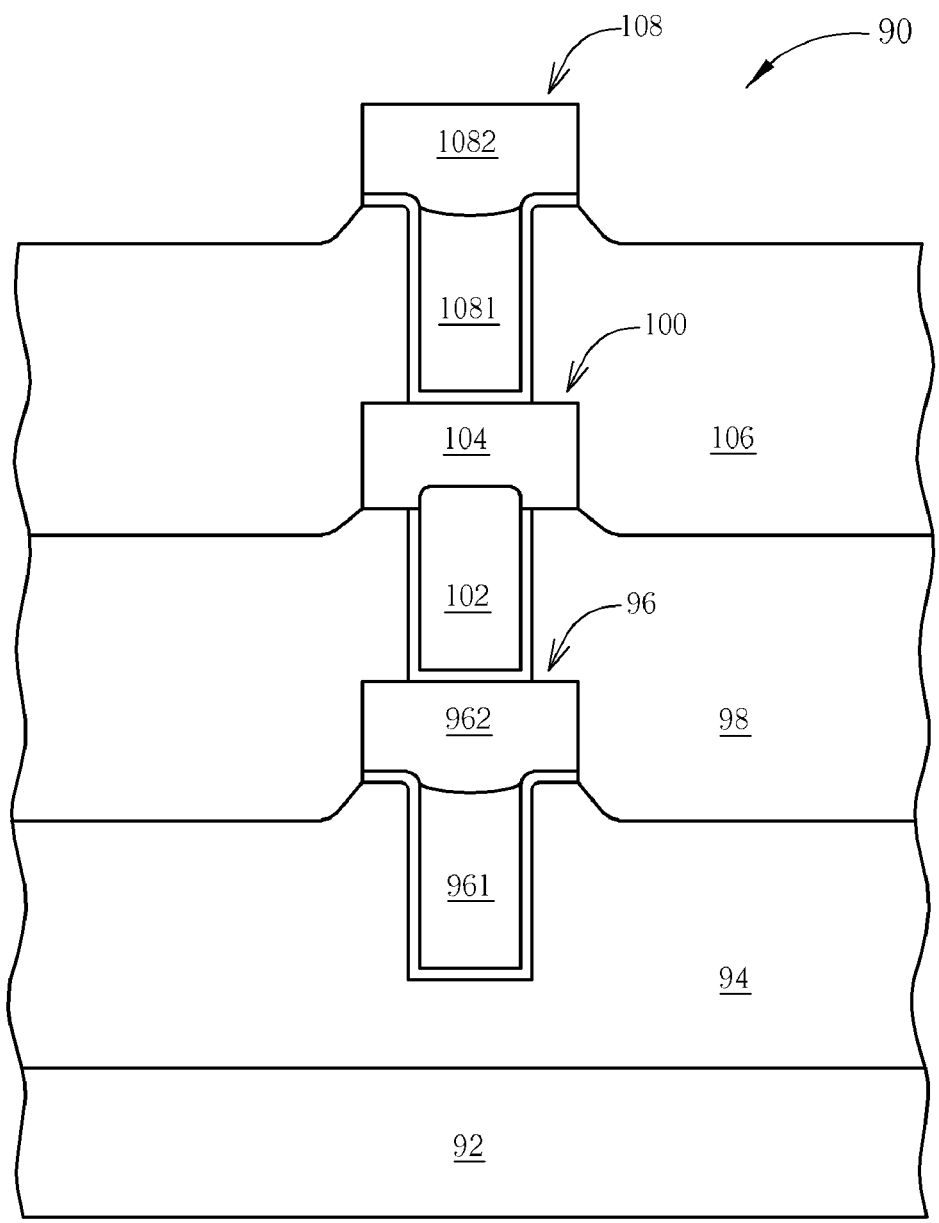
FIG. 10 further illustrates a schematic diagram of a reworked integrated circuit device according to the second preferred embodiment of the present invention.

Please refer to FIG. 10, which is a schematic diagram illustrating an another reworked integrated circuit device 90 according to another preferred embodiment of the present invention. The Integrated circuit device 90 includes a substrate 92, a plurality of dielectric layers 94, 98, 106 formed on the substrate 92, and a plurality of metal interconnections 96, 100, 108 embedded in the dielectric layers 94, 98, 106. The metal interconnections 96, 100, 108 of the present embodiment are made of a conductive material and each respectively forms a contact plug 961, 102, 1081, and a conductive trace 962, 104, 1082; and the metal interconnections use the contact plugs for electrically coupling to the conductive traces. A barrier layer is formed between each of the metal interconnections and each of the dielectric layers. The barrier layer prevents the metal of the metal interconnections diffusing from the metal interconnection to the dielectric layer. The metal interconnection of the present invention may be a conductive trace made of copper formed by a dual damascene process; a metal layer; a wiring layer; a silicide layer comprising Ti, Co, Ni, or Cu; a poly electrode; or other types of metal interconnections formed by known processes. Furthermore, the contact plugs 961, 1081 shown in FIG. 10 are formed by processes including a CMP process. Consequently, a part of the barrier layer remains on the dielectric layers 94, 106. If the contact plugs 961, 1081 is formed by process including a etch back process to planarize a surface of the contact plugs 961, 1081, the barrier layer on the surface of the dielectric layers 94, 106 will be removed. The conductive traces 962, 1082 contact the dielectric layers 94, 106, respectively.

The integrated circuit device 90 includes a first dielectric layer 94 formed on a substrate 92, a first metal interconnection 96 embedded in the first dielectric layer 94, and a second dielectric layer 98 covering on the first dielectric layer 94 and the first metal interconnection 96. The integrated circuit device 90 also has a second metal interconnection 100 embedded in the second dielectric layer 98. The second metal interconnection 100 includes a contact plug 102 and a conductive trace 104 formed on the contact plug 102. The integrated circuit device 90 further has a third dielectric layer 106 covering the second dielectric layer 98 and the second metal interconnection 100, and a third metal interconnection 108 embedded in the third dielectric layer 106. The second metal interconnection 100 is formed by the reworking method of the present invention that is distinct from those metal interconnections without performing the reworking method of the present invention, such as the first metal interconnection 96 or the third metal interconnection 108. Comparing to the first metal interconnection 96 and the third intermetal connection 108, the top surface of the contact plug 102 is protruded from the surface of the second dielectric layer 98.

As shown in FIG. 10, the first metal interconnection 96 and the third metal interconnection 108 of the integrated circuit device 90 are formed without any reworking method performed. The first dielectric layer 94 and the third dielectric layer 106 will be etched once during the pattern defining process to define the conductive traces 962, 1082; and a respective smooth edge of the first dielectric layer 94 and the third dielectric layer 106 is formed next to the conductive trace 962, 1082. However, the second metal interconnection 100 is formed by the reworking method of the present invention. The etch back process of the reworking method etches the second dielectric layer 98. Thus, the top surface of the contact plug 102 is protruded from the surface of the second dielectric layer 98. Compared to the top surface of the contact plug 102, the top surfaces of the contact plugs 961, 1081 and the surfaces of the dielectric layers 94, 106 are on the same plane. The metal interconnections of the present embodiment are shown as a simplified diagram. The material of the metal interconnections may use the same material as those of the metal interconnections of the aforementioned embodiments. Since the reworking method of the present embodiment is performed on the conductive layer as an entire plane structure, the step-like edge of the second dielectric layer 98 next to the conductive layer would not be formed.

The reworking method of the present invention is used for reworking the second metal interconnection as an example. The reworking method of the present invention may also be performed on other metal interconnections of the integrated circuit device. In view of the reworking method of the present invention, the reworking method of the present invention may also be performed on the first metal interconnection, the third metal interconnection, or other metal interconnections of the integrated circuit device.

Additionally, the reworking method of the present invention may be performed on a metal interconnection covered by an interlayer dielectric layer (ILD). The metal interconnection covered by the ILD layer may be etched by a two-step etch process. The ILD layer is removed in the first etch step, and a substantial portion of the conductive layer of the metal interconnection is removed in the second etch step. A CMP process is performed to remove the connective layer residue, and the metal interconnection is rebuilt by using several processes, including a deposition, a lithography, and an etch process.

Figure 11:
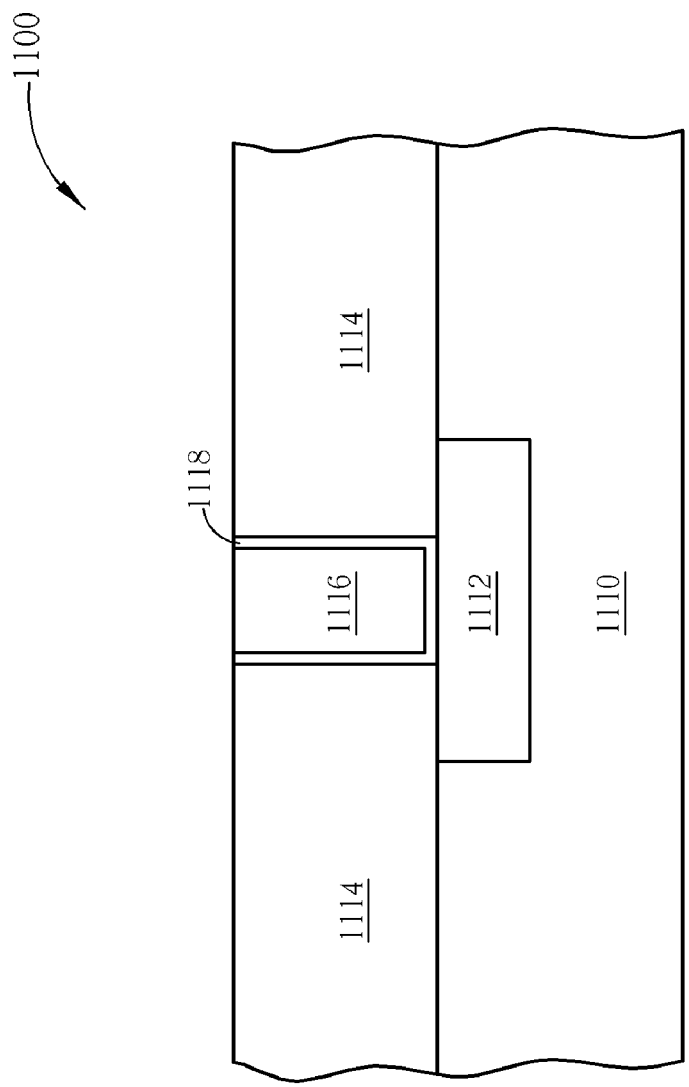
FIG. 11 shows an integrated circuit device formed by a damascene process and a Cu process.

The reworking method of the present invention may be performed on a damascene structure, which is formed by a damascene process and a Cu process. The steps of the reworking method may be modified. Please refer to FIG. 11. FIG. 11 shows an integrated circuit device 1100 formed by a damascene process and a Cu process. The integrated circuit device 1100 has a substrate 1110, a conductive material layer 1112 formed in the substrate 1110, a dielectric layer 1114 formed on the substrate 1110, a metal interconnection 1116 of Cu embedded in the dielectric layer 1114, and a barrier layer 1118 disposed between the metal interconnection 1116 and the dielectric layer 1114. When defects are formed on the integrated circuit device 1100, a reworking method is performed as follows. Initially, the dielectric layer 1114 is removed, and the metal interconnection 1116 and the barrier layer 1118 are removed. The method of removing the metal interconnection 1116 and the barrier layer 1118 may be selected from one of the following process.

a) A CMP process is performed that directly polishes the metal interconnection 1116 and the barrier layer 1118; or b) An etch back process is performed and a CMP process is performed subsequent to the etch back process. The etch back process and the CMP process cooperatively remove the metal interconnection 1116 and the barrier layer 1118.

After the dielectric layer 1114, the metal interconnection 1116, and the barrier layer 1118 are removed, a dielectric layer is reformed on the substrate 1110. A barrier layer and a metal interconnection embedded in the dielectric layer are reformed by known process to complete the reworking method.

Figure 12:
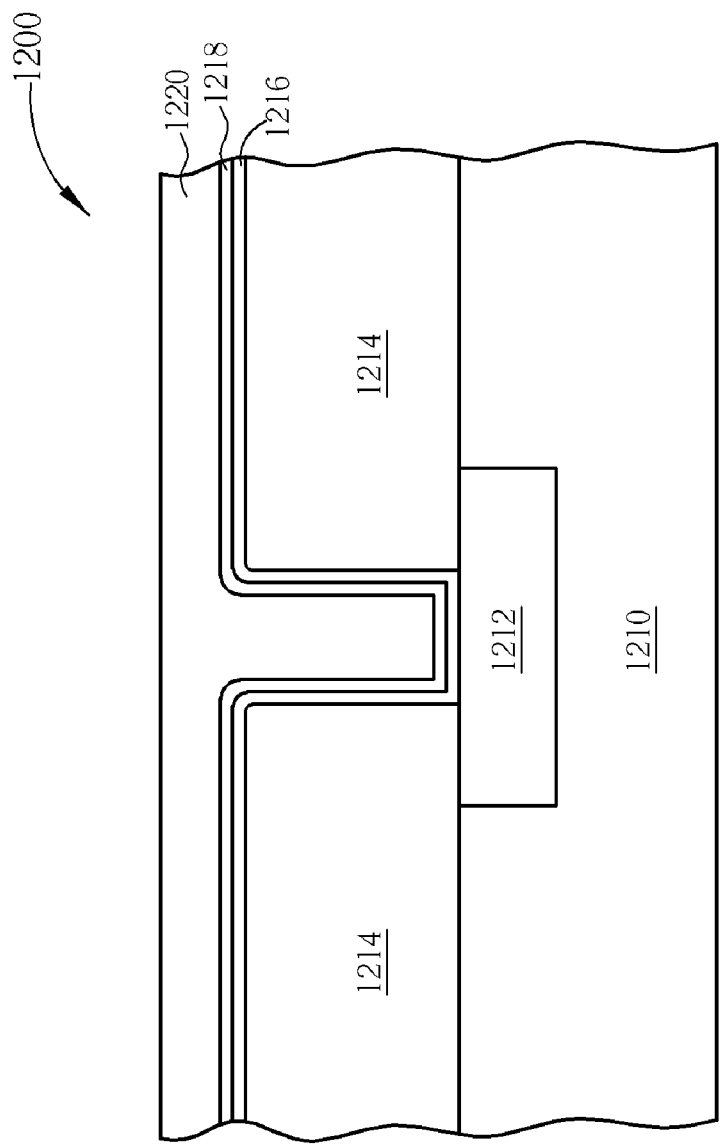
FIG. 12 shows another integrated circuit device after the films are deposited on the dielectric layer and prior to the CMP process being performed.

Moreover, the reworking method of the present invention may be performed on a damascene structure after the films are deposited on the dielectric layer and prior to a CMP process. Please refer to FIG. 12, which shows an integrated circuit device 1200 after the films are deposited on the dielectric layer and prior to the CMP process being performed. The integrated circuit device 1200 has a substrate 1210, a conductive material layer 1212 formed in the substrate 1210, a dielectric layer 1214 formed on the substrate 1210, and a barrier layer 1216, a seed layer 1218, and a conductive layer 1220 of Cu subsequently formed on a surface of the dielectric layer 1214. When defects are formed on the integrated circuit device 1200, a reworking method is performed as multi-step processes.

Initially, those films formed on the dielectric layer 1214 are removed by a CMP process or an etch process. Each process may remove one layer of the films or more than one layer of the films, including conductive layer 1220, a seed layer 1218, and a barrier layer 1216, disposed on the dielectric layer 1216. After a surface of the dielectric layer 1214 is revealed, the dielectric layer 1214 can be removed. Subsequently, the remains of the conductive layer 1210, the seed layer 1218, and the barrier layer 1216 are removed. The method of removing the remains of the conductive layer 1210, the seed layer 1218, and the barrier layer 1216 may be selected from one of the following processes.

a) A CMP process is performed and directly polishes the conductive layer 1220, the seed layer 1218, and the barrier layer; or b) An etch back process is performed and a CMP process is performed subsequent to the etch back process. The etch back process and the CMP process cooperatively remove the conductive layer 1220, the seed layer 1218, and barrier layer 1216 disposed on the substrate 1210.

The conductive layer 1220, the seed layer 1218, and the barrier layer 1216 may be removed subsequently from the top to the bottom, or one or more of the films may be removed at the same process. After the defects formed on the conductive layer 1220, the seed layer 1218, the barrier layer 1216, and the dielectric layer 1214 are removed, a dielectric layer is reformed on the substrate 1210. The barrier layer, the seed layer, and the conductive layer are reformed by known processes to complete the reworking method of the present invention.

According to the abovementioned embodiments, the reworking method of the present invention includes an etch back process and a CMP process to remove the defects on the conductive layer or the conductive trace. When the defects on the conductive layer or the conductive trace are removed with nothing more than a CMP process, the metal material of the conductive layer (or the conductive trace) cannot be easily removed by the CMP process. It may take an extended period of time. Since the CMP process polishes the dielectric layer and the contact plug in different polishing rates, a rugged and uneven surface of the dielectric layer will be formed. Accordingly, those skilled in the art will not remove the conductive layer (or the conductive trace) by using nothing more than a CMP process. On the other hand, if the conductive layer (or the conductive trace) is removed only by performing an etch back process, the conductive layer (or the conductive trace) cannot be removed completely owing to particle contamination. A conductive layer residue 241 is left behind on the second dielectric layer 16 as shown in FIG. 2. As a result, the conductive layer or the conductive trace cannot be removed effectively by using a CMP process or an etch back process alone.

The reworking method of the present invention is performed without affecting reliability of the integrated circuit device. The reworking method of the present invention removes the undesirable conductive layer (or the undesirable conductive trace) effectively and costs lesser time. The performance of the reworking method of the present invention reduces production cost and prevents the integrated circuit devices from scraping.

Those skilled in the art will readily observe that numerous modifications and alterations of the device and method may be made while retaining the teachings of the invention.

What is claimed is:

1. A reworking method for removing a defect on an integrated circuit device, comprising:
   providing an integrated circuit device, comprising a substrate, a conductive material layer formed in the substrate, a dielectric layer formed on the substrate, at least one contact plug, connecting to the conductive material layer, embedded in the dielectric layer, and a conductive layer, connecting to the contact plug, formed on the dielectric layer;
   performing an etch back process for removing the conductive layer and exposing the contact plug and revealing a surface of the dielectric layer;
   performing a chemical mechanical polishing process on the dielectric layer;
   reforming a conductive layer on the dielectric layer; and the reformed conductive layer contacting the contact plug; and
   defining a pattern of conductive trace on the substrate, wherein a top surface of the substrate has a step-like edge positioned next to the conductive trace.

2. The reworking method of claim 1, further comprising performing an inspection process before the etch back process is performed.

3. The reworking method of claim 1, wherein the conductive layer has a pattern defined for use as conductive traces.

4. The reworking method of claim 1, wherein the integrated circuit device further comprises an anti-reflective layer formed on the conductive layer.

5. The reworking method of claim 1, wherein the etch back process comprises a dry etch process.

6. The reworking method of claim 1, wherein the contact plug comprises tungsten, aluminum, copper, or combinations thereof.

7. The reworking method of claim 1, wherein the conductive layer comprise aluminum, aluminum-copper alloy (AlCu), titanium, titanium nitride (TiN), or combinations thereof.

8. The reworking method of claim 1, wherein the etching rate of the conductive layer is faster than the etching rate of the contact plug during the etch back process.

9. A reworked integrated circuit device, comprising
   a substrate having a conductive material layer formed therein; and
   a metal interconnection disposed on the substrate; the metal interconnection comprising a conductive trace and a top surface of the substrate having a step-like edge positioned next to the conductive trace.

10. The reworked integrated circuit device of claim 9, wherein the metal interconnection further comprises a contact plug electrically connecting to the conductive material layer; and the contact plug has a top surface protruded from the substrate.

11. The reworked integrated circuit device of claim 10, wherein the contact plug comprises tungsten, aluminum, copper, or combinations thereof.

12. The reworked integrated circuit device of claim 9, wherein the conductive trace comprises aluminum, aluminum-copper alloy, titanium, titanium nitride, or combinations thereof.

13. The reworked integrated circuit device of claim 10, wherein the substrate further comprises a dielectric layer, in which the metal interconnection is embedded in the dielectric layer, and the top surface of the contact plug is protruded from the dielectric layer.

* * * * *